United States Patent [19]
Yu

[11] Patent Number: 6,107,205
[45] Date of Patent: Aug. 22, 2000

[54] METHOD FOR REMOVING PHOTORESIST

[75] Inventor: Chia-Chieh Yu, Taipei, Taiwan

[73] Assignee: United Semiconductor Corp., Hsinchu, Taiwan

[21] Appl. No.: 09/246,737

[22] Filed: Feb. 8, 1999

[30] Foreign Application Priority Data

Nov. 21, 1998 [TW] Taiwan .................................. 87119323

[51] Int. Cl.[7] .................................................. H01L 21/311

[52] U.S. Cl. .......................... 438/700; 438/710; 438/733

[58] Field of Search .................................. 438/710, 700, 438/733

[56] References Cited

U.S. PATENT DOCUMENTS

| | | | |
|---|---|---|---|
| 5,480,048 | 1/1996 | Kitamura et al. | 216/13 |
| 5,897,374 | 4/1999 | Lin | 438/666 |
| 5,899,738 | 5/1999 | Wu et al. | 438/618 |
| 5,981,354 | 11/1999 | Spikes et al. | 438/424 |

*Primary Examiner*—Benjamin L. Utech
*Assistant Examiner*—Vanessa Perez-Romos
*Attorney, Agent, or Firm*—J. C. Patents; Jiawei Huang

[57] ABSTRACT

A method for removing a photoresist. A substrate having a wire on the substrate and a flowable oxide layer over the substrate and a patterned photoresist over the flowable oxide layer is provided. A plasma etching step is performed by using an additional gas mixed with oxygen as a source to remove the photoresist layer.

11 Claims, 3 Drawing Sheets

METHOD FOR REMOVING PHOTORESIST

CROSS-REFERENCE TO RELATED APPLICATION

This application claims the priority benefit of Taiwan application Ser. No. 87119322, filed Nov. 21, 1998.

BACKGROUND OF THE INVENTION

1. Field of the Invention

The present invention relates to a method of manufacturing a semiconductor device. More particularly, the present invention relates to a method of removing a photoresist.

2. Description of the Related Art

Due to the increasingly high integration of ICs, chips simply cannot provide sufficient area for manufacturing interconnections. Therefore, in accord with the increased interconnects manufacturing requirements of miniaturized MOS transistors, it is increasingly necessary for IC manufacturing to adopt a design with more than two conductive layers. Generally, an inter-metal dielectric (IMD) layer is used to electrically isolate two adjacent conductive layers from each other. Moreover, a conductive layer used to electrically connect the two adjacent metal layers is called a via plug.

Typically, a sandwich structure of conductive material-insulating material-conductive material between two adjacent conductive layers in multilevel interconnects would lead to the parasitic capacitor effect. The parasitic capacitor effect induces resistor-capacitor time delay (RC time delay), so that the operation rate of the device is slow. In order to reduce the parasitic capacitor effect, it is necessary to form an IMD layer with a low dielectric constant between two adjacent conductive layers. Preferably, the material used to form dielectric layer with low dielectric constant is a flowable oxide.

Currently, the IMD layer includes many layers. Usually, the IMD layer is composed of a barrier oxide layer conformal to the interconnects, a flowable oxide layer over the barrier oxide layer and a cap oxide layer over the flowable oxide layer. Sometimes, it further comprises an insulating layer between the flowable oxide layer and the cap oxide layer. The structure of the IMD layer mentioned above provides an insulating material with a relatively low dielectric constant between two adjacent conductive layers. Hence, the parasitic capacitance between two adjacent conductive layers can be reduced.

Conventionally, the method of manufacturing a via plug comprises the steps of forming a via hole in the IMD layer exposed by a patterned photoresist to expose the subjacent interconnects. The photoresist is stripped away by oxygen ($O_2$) plasma and the wafer is cleaned with solvent to remove residual photoresist. While the $O_2$ plasma process is performed to strip away the photoresist, portions of the flowable oxide layer exposed by the via hole are bombarded by the $O_2$ plasma. After the wafer is cleaned with solvent, the number of Si—H bonds in the flowable oxide layer is decreased and that of Si—OH bonds in the flowable oxide layer is increased.

The decrease of Si—H bonds in the flowable oxide layer leads to the increase of the dielectric constant of the flowable oxide layer. Therefore, the parasitic capacitance between two adjacent conductive layers and RC time delay are also increased. Moreover, the operation rate of the device becomes slow. Additionally, the increment of Si—OH bonds in the flowable oxide layer means that water absorption by the surface of the flowable oxide layer is increased. While the via hole is filled with the conductive material in subsequent processes, the water absorbing on the surface of the flowable oxide layer is transformed into bubbles in the via plug because the temperature is high. Because of the bubbles, the conductive material fails to fill the via hole, which is called a blind contact. The open circuit caused by a blind contact occurs between two adjacent conductive layers that should be electrically coupled to each other. Hence, errors occur when the devices are used and the devices cannot be controlled.

SUMMARY OF THE INVENTION

It is therefore an objective of the invention to provide a method of removing a photoresist without increasing the dielectric constant of the inter-metal dielectric layer. The invention can maintain the dielectric constant of the inter-metal dielectric layer and prevent the via hole from forming a blind contact.

To achieve these and other advantages and in accordance with the purpose of the invention, as embodied and broadly described herein, the invention provides a method of removing a photoresist. A substrate having a wire on the substrate and a flowable oxide layer over the substrate and a patterned photoresist over the flowable oxide layer is provided. A plasma etching step is performed by using an additional gas mixed with oxygen as a source to remove the photoresist layer. Since the number of Si—H bonds in the flowable oxide layer is not decreased, the dielectric constant of the flowable oxide layer still is low. Furthermore, there are fewer Si—OH bonds in the flowable oxide layer, so the blind contact can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
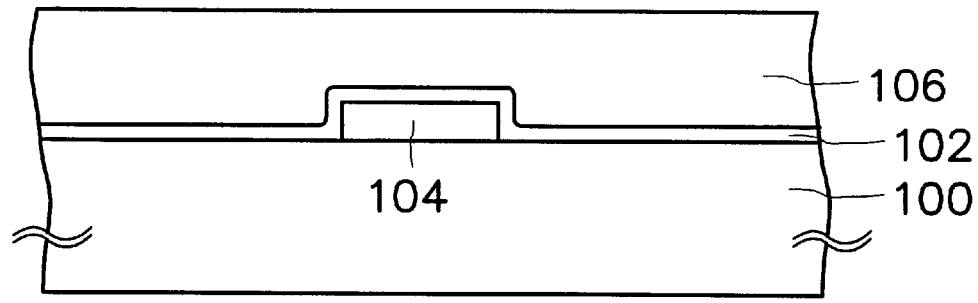
FIGS. 1A through 1D are schematic, cross-sectional views of the process for manufacturing a via plug in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are schematic, cross-sectional views of the process for manufacturing a via plug in a preferred embodiment according to the invention.

As shown in FIG. 1A, a substrate 100 having wire 104 on the surface of the substrate 100 is provided. A barrier oxide layer 102 is conformally formed on the substrate 100 and the wire 104. A flowable oxide layer 106 is formed on the barrier oxide layer 102. The method of forming the flowable oxide layer 106 can be one of coating a layer of flowable oxide on the barrier oxide layer 102, for example.

Figure 1B:
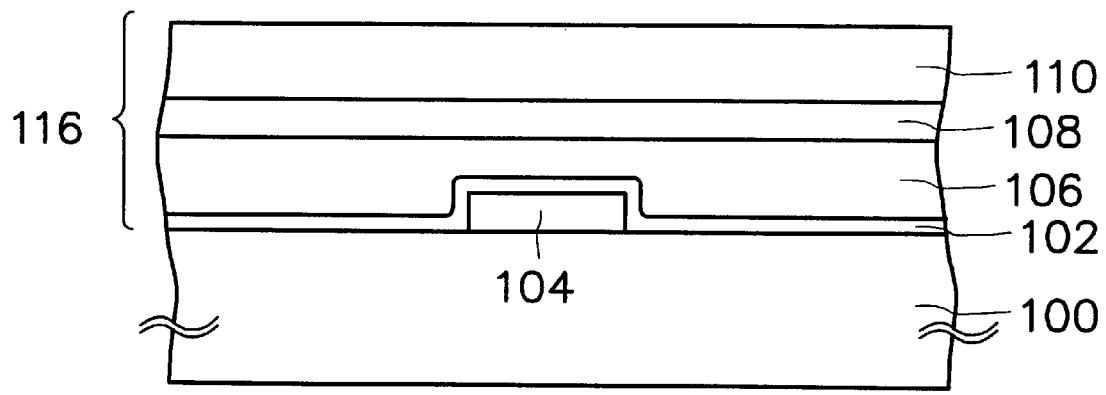

As shown in FIG. 1B, an ion implantation step is performed to convert upper portions of the flowable oxide layer 106 into an insulating layer 108. A cap oxide layer 110 is formed on the insulating layer 108. The barrier layer 102, the flowable oxide layer 106, the insulating layer 108 and the cap oxide layer 110 together form an IMD layer 116.

Figure 1C:
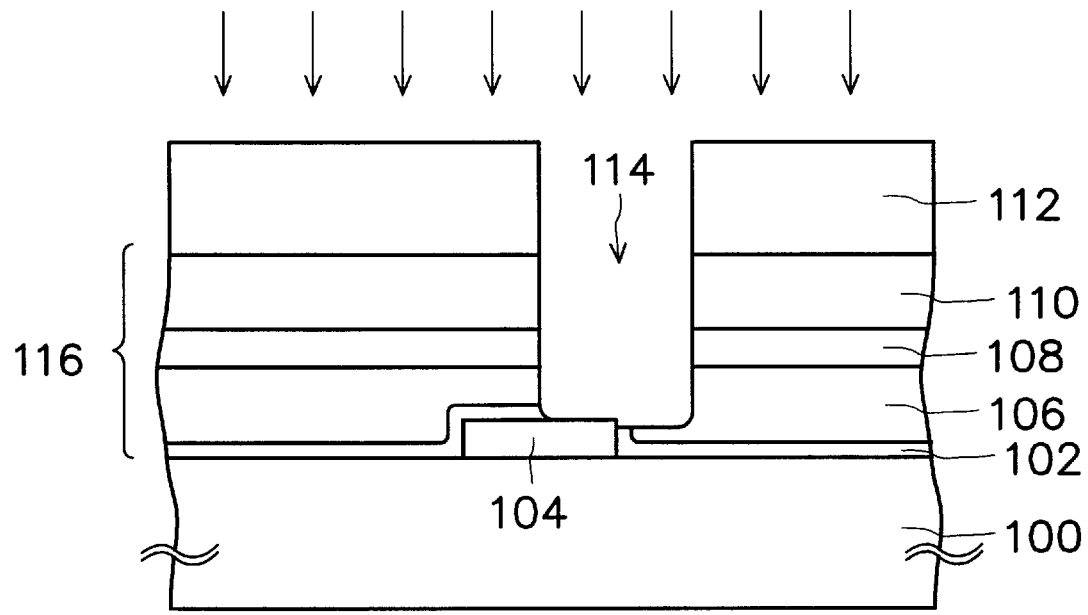

As shown in FIG. 1C, a patterned photoresist 112 is formed on the IMD layer 116. An etching step is used to form a via hole 114 in the IMD layer 116 exposed by the photoresist 112 until a portion of the wire 104 is exposed. The etching step can be anisotropic etching. Since the via hole 114 penetrates through the IMD layer 116, the barrier layer 102, the flowable oxide layer 106, the insulating layer 108 and the cap oxide layer 110 are exposed by the via hole 114. A plasma etching step is used to remove the photoresist 112 by using an additional gas mixed with oxygen ($O_2$/additional gas) as source. The additional gas can be an $H_2O$-containing gas, for example.

Figure 1D:
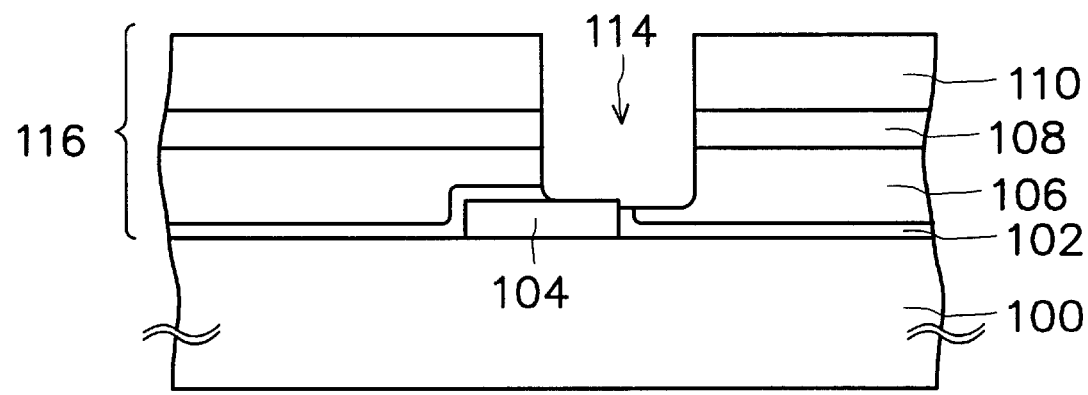

As shown in FIG. 1D, the via hole 114 and the cap oxide layer 110 are cleaned by a solvent to strip away the residual photoresist 112. The solvent can be an alkaloid solvent having amines, for example.

Figure 2:
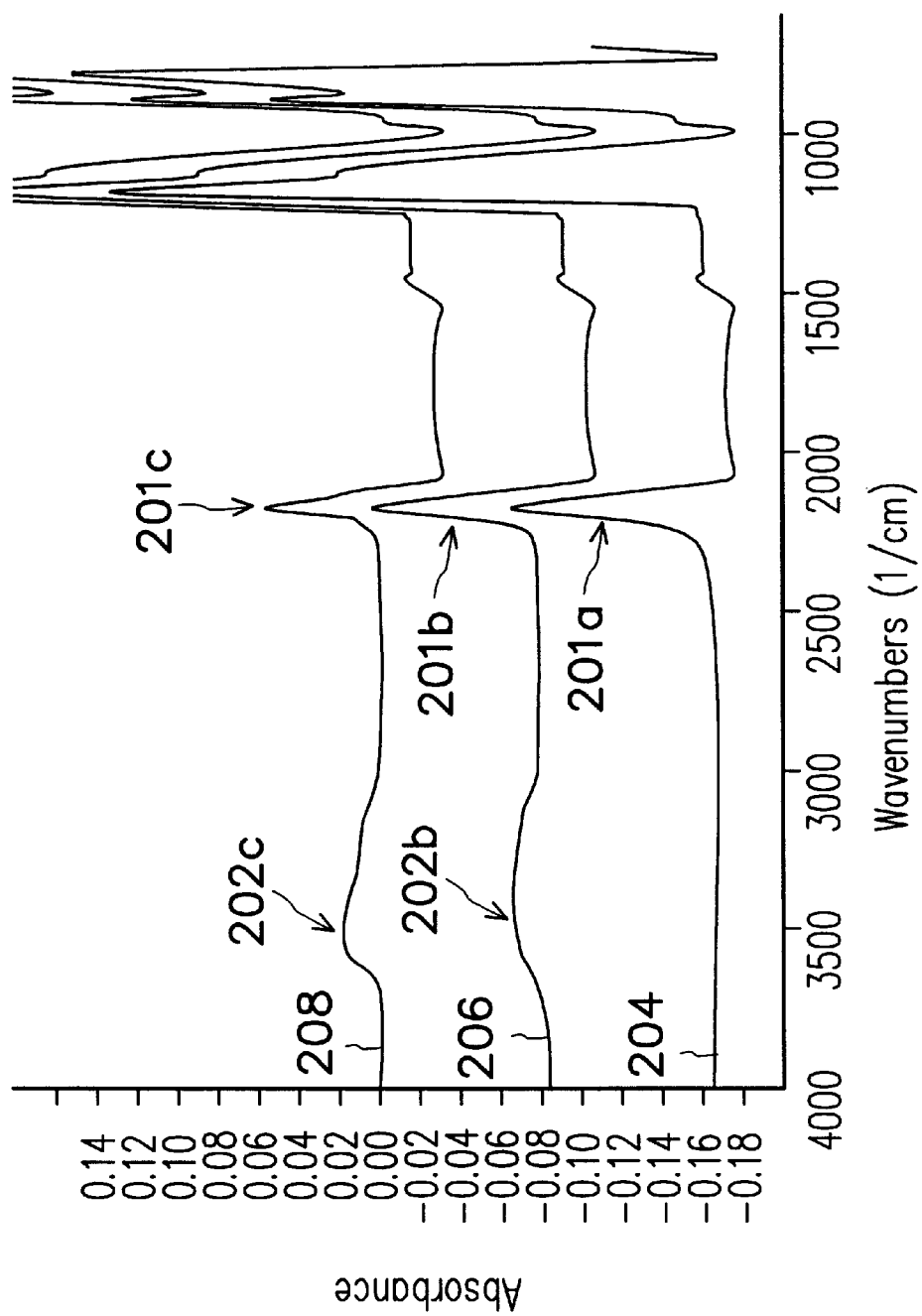
FIG. 2 is Fourier-transfer infrared (FTIR) absorption spectrograms of three flowable oxide layers respectively treated by three different photoresist-removing methods.

FIG. 2 is Fourier-transfer infrared (FTIR) absorption spectrogram of three flowable oxide layers respectively treated by three different photoresist removing methods. The FTIR signal of the flowable oxide layer for which the photoresist over the flowable oxide layer is not stripped away by plasma is denoted as a signal 204. The FTIR signal of the flowable oxide layer for which the photoresist over the flowable oxide layer is stripped away by $O_2$/additional gas plasma and solvent according to the invention is denoted as a signal 206. The FTIR signal of the flowable oxide layer for which the photoresist over the flowable oxide layer is stripped away by $O_2$ plasma and solvent according to the conventional method is denoted as a signal 208. The absorption peak of Si—H bonds in the flowable oxide layer is at about 2300 wavenumbers ($cm^{-1}$). The Si—H bonds absorption peak of signals 204, 206 and 208 are respectively denoted as peaks 201a, 201b and 201c. The absorption peak of Si—OH bonds in the flowable oxide layer is at about 3500 wavenumbers ($cm^{-1}$). The Si—OH bonds absorption peak of signals 206 and 208 are respectively denoted as peaks 202b and 202c.

By comparing the corresponding absorption peaks of signal 208 and signal 204, the intensity of signal 204 at the peak 201a is higher than that of signal 208 at the peak 201c. This means that the numbers of Si—H bonds in the flowable oxide layer is decreased after the photoresist is stripped away by $O_2$ plasma and solvent according to the conventional method. Hence, after the conventional method is performed, the dielectric constant of the flowable oxide layer and the parasitic capacitance are increased. Additionally, Si—OH bonds are present after the conventional method is performed. This means that water absorbed by the surface of the flowable oxide layer exposed by the via hole is increased. The water absorbed by the flowable oxide layer leads to a blind contact.

However, by comparing signal 206 with signals 204 and 208, the intensity of signal 206 at the peak 201b is similar to that of signal 204 at the peak 201a, and the intensity of signal 206 at the peak 202b is smaller than that of signal 208 at the peak 202c. This denotes that the numbers of the Si—H bonds in the flowable oxide layer does not decrease, or at least not significantly decrease after the photoresist is stripped away by $O_2$/additional gas plasma and solvent according to the invention. Therefore, the low dielectric constant of the flowable oxide layer is maintained by using the removing photoresist method according to the invention, and the parasitic capacitor effect presented between two adjacent conductive layers in devices can be avoided. Moreover, the number of Si—OH bonds in the flowable oxide layer formed according to the invention is less than that formed according to the conventional method. This means that there is no water, or at least no significant amount of water, being absorbed by the surface of the flowable oxide layer exposed by the via hole. Since there is no water absorbed by the surface of the flowable oxide layer exposed by the via hole, the blind contact can be avoided.

The preferred embodiment according to the invention is denoted by manufacturing a via hole in the IMD. It is appreciated that people skilled in the art may also adopt the technique mentioned above to fabricate different kinds of openings such as contact holes and trenches according to the specific requirement.

In the invention, although, the etching plasma using $O_2$/additional gas as a gas source bombards portions of the flowable oxide layer exposed by the via hole, the numbers of Si—H bonds in the flowable oxide layer are not decreased. Thus, the dielectric constant of the flowable oxide layer still is low. Furthermore, the numbers of Si—OH bonds in the flowable oxide layer are less, so that the blind contact can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for removing a photoresist from a substrate having a flowable oxide layer over the substrate, wherein a patterned photoresist lies over the flowable oxide layer, the method comprising the step of performing a plasma etching step using an additional gas mixed with oxygen as a source to remove the photoresist layer, so as to minimize a reduction of Si—H bonds and an increase of Si—OH bonds in the flowable oxide layer during the plasma etching step.

2. The method of claim 1, wherein the additional gas includes an $H_2O$-containing gas.

3. The method of claim 1, further comprising a step of removing residual photoresist with a solvent after the plasma etching step.

4. The method of claim 3, wherein the solvent includes an alkaloid solvent having amines.

5. A method of manufacturing a via hole suitable for a substrate having a wire on the substrate and an inter-metal dielectric layer over the substrate, wherein a patterned photoresist lies over the inter-metal dielectric layer, the method comprising the steps of:

forming a via hole in the inter-metal dielectric layer to expose a portion of the wire; and performing an plasma etching step using an additional gas mixed with oxygen as a source to remove the photoresist layer.

6. The method of claim 5, wherein the additional gas includes an $H_2O$-containing gas.

7. The method of claim 5, wherein the inter-metal dielectric layer comprises a flowable oxide layer and a cap oxide layer.

8. The method of claim 7, wherein an insulating layer is further comprised between the flowable oxide layer and the cap oxide layer.

9. The method of claim 5, wherein the step of forming the via hole includes an anisotropic etching.

10. The method of claim 5, further comprising a step of removing residual photoresist with a solvent after the plasma etching step.

11. The method of claim 10, wherein the solvent includes an alkaloid solvent having amines.

* * * * *